United States Patent
Loftus

(10) Patent No.: US 9,673,653 B2
(45) Date of Patent: Jun. 6, 2017

(54) CONTROL OF POWER FLOW IN BATTERY CELLS OF A VEHICLE

(71) Applicant: Ford Global Technologies, LLC, Dearborn, MI (US)

(72) Inventor: Michael Edward Loftus, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 610 days.

(21) Appl. No.: 13/799,600

(22) Filed: Mar. 13, 2013

(65) Prior Publication Data

US 2014/0266063 A1    Sep. 18, 2014

(51) Int. Cl.
| | | |
|---|---|---|
| B60L 11/18 | (2006.01) | |
| H02J 7/00 | (2006.01) | |
| G01R 31/36 | (2006.01) | |
| B60W 20/00 | (2016.01) | |
| H01M 10/42 | (2006.01) | |

(52) U.S. Cl.
CPC ......... *H02J 7/0068* (2013.01); *B60L 11/1866* (2013.01); *H02J 7/0016* (2013.01); *B60L 2240/547* (2013.01); *G01R 31/3658* (2013.01); *H01M 2010/4271* (2013.01); *Y02T 10/7005* (2013.01); *Y02T 10/7055* (2013.01); *Y02T 10/7061* (2013.01); *Y02T 90/16* (2013.01)

(58) Field of Classification Search
CPC ........... H02J 7/0098; H02J 2007/0014; H01M 2010/4271; Y02T 10/7291; Y02T 90/161; Y02T 90/162; Y02T 90/165
USPC ........................................................ 320/136
See application file for complete search history.

(56) References Cited

U.S. PATENT DOCUMENTS

| | | | |
|---|---|---|---|
| 6,198,995 B1 | 3/2001 | Settles | |
| 6,487,477 B1* | 11/2002 | Woestman | B60K 6/365 |
| | | | 180/65.235 |
| 7,570,015 B2* | 8/2009 | Bansal et al. | 320/106 |
| 7,692,401 B2* | 4/2010 | Gonzales et al. | 320/104 |

(Continued)

FOREIGN PATENT DOCUMENTS

| | | |
|---|---|---|
| JP | 2008-131173 | 6/2008 |
| KR | 10-2010-0116447 | 11/2010 |

OTHER PUBLICATIONS

ECU Testing for Electric and Hybrid Vehicles, Automotive Elektronik, Germany, Aug. 2011.
Stuart, Thomas, A Modular Battery Management Systems for HEVs.

*Primary Examiner* — Samuel Berhanu
*Assistant Examiner* — Tarikh Rankine
(74) *Attorney, Agent, or Firm* — David B. Kelley; Brooks Kushman P.C.

(57) ABSTRACT

A vehicle includes a high voltage traction battery for providing propulsion energy to the vehicle. A battery control module controls the operation of the battery, and also commands cell balancing out of or between cells of the battery to maintain a relative equilibrium of charge across a plurality of the cells. The battery control module is in communication with an interactive display in the vehicle or a communication device outside of the vehicle. A user can define a time period in which the vehicle is to enter a hibernation mode. During the hibernation mode, the battery control module inhibits cell balancing in the battery. Upon expiration of the user-defined time period, the battery control module enables cell balancing.

19 Claims, 2 Drawing Sheets

(56) References Cited

U.S. PATENT DOCUMENTS

| | | | |
|---|---|---|---|
| 8,368,353 B2* | 2/2013 | Akiba et al. | 320/109 |
| 2006/0108971 A1 | 5/2006 | Ono | |
| 2007/0093943 A1 | 4/2007 | Nelson | |
| 2009/0003138 A1* | 1/2009 | Donnelli et al. | 368/28 |
| 2009/0062967 A1* | 3/2009 | Kressner et al. | 700/286 |
| 2009/0082909 A1 | 3/2009 | Sakane | |
| 2009/0096285 A1* | 4/2009 | Acena | B60L 11/005 307/10.1 |
| 2009/0167248 A1* | 7/2009 | Murao | H02J 7/0016 320/134 |
| 2010/0262404 A1 | 10/2010 | Bertness | |
| 2010/0312464 A1* | 12/2010 | Fitzgerald et al. | 701/200 |
| 2011/0248678 A1* | 10/2011 | Wade | H02J 7/0014 320/119 |
| 2012/0086401 A1* | 4/2012 | Laber et al. | 320/118 |
| 2013/0026993 A1* | 1/2013 | Hintz et al. | 320/119 |
| 2013/0113432 A1* | 5/2013 | Suzuki | H02J 7/0014 320/134 |
| 2013/0221928 A1* | 8/2013 | Kelty et al. | 320/134 |
| 2014/0006137 A1* | 1/2014 | Melen et al. | 705/14.35 |

* cited by examiner

US 9,673,653 B2

CONTROL OF POWER FLOW IN BATTERY CELLS OF A VEHICLE

TECHNICAL FIELD

The present disclosure generally relates to controlling cell balancing in a vehicle having a high voltage traction battery.

BACKGROUND

A hybrid electric vehicle (HEV) can be propelled by an engine and a traction battery. A plug-in hybrid electric vehicle (PHEV) includes a traction battery that can be charged via electrically connection to an external power source. A battery electric vehicle (BEV) does not include an engine and is propelled only by a traction battery. HEV's, PHEV's and BEV's are three examples of vehicles that are at least partially propelled by a traction battery. In such applications, the traction battery can include a battery pack having individual cells that are charged and discharged during operation. The traction battery may also discharge electric power from and transfer electric power between the cells during cell balancing operations.

SUMMARY

According to one embodiment, a system for controlling cell balancing within a battery electric vehicle is provided. The system comprises a battery back including a plurality of cells. An electric machine is configured to transform electrical energy from the battery pack to motive power for the vehicle. A user interface is provided within the vehicle. At least one controller is in communication with the battery pack and the user interface. The at least one controller is programmed to (i) provide an interactive calendar to the user interface for a user to input a starting-moment and an ending-moment, (ii) inhibit cell balancing while the vehicle is OFF for a time between the starting-moment and the ending-moment, and (ii) command cell balancing subsequent to the ending-moment.

According to another embodiment, a vehicle comprises a battery back including a plurality of cells. An electric machine is configured to transform electrical power form the battery pack into motive power for the vehicle. At least one controller is programmed to inhibit cell balancing for a user-defined time period. The at least one controller may further be programmed to command cell balancing in response to an expiration of the user-defined time period.

According to yet another embodiment, a method of controlling cell-balancing functions in a vehicle having a high-voltage fraction battery is provided. The method includes inhibiting cell balancing within a high-voltage traction battery for a user-defined time period. The method may further comprise subsequently enabling the cell balancing in response to an expiration of the user defined time period, subsequent to the step of inhibiting. The method may further comprise displaying a calendar on a user interface, wherein the user-defined period is defined by a start-date and an end-date selected by the user on the calendar of the user interface.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
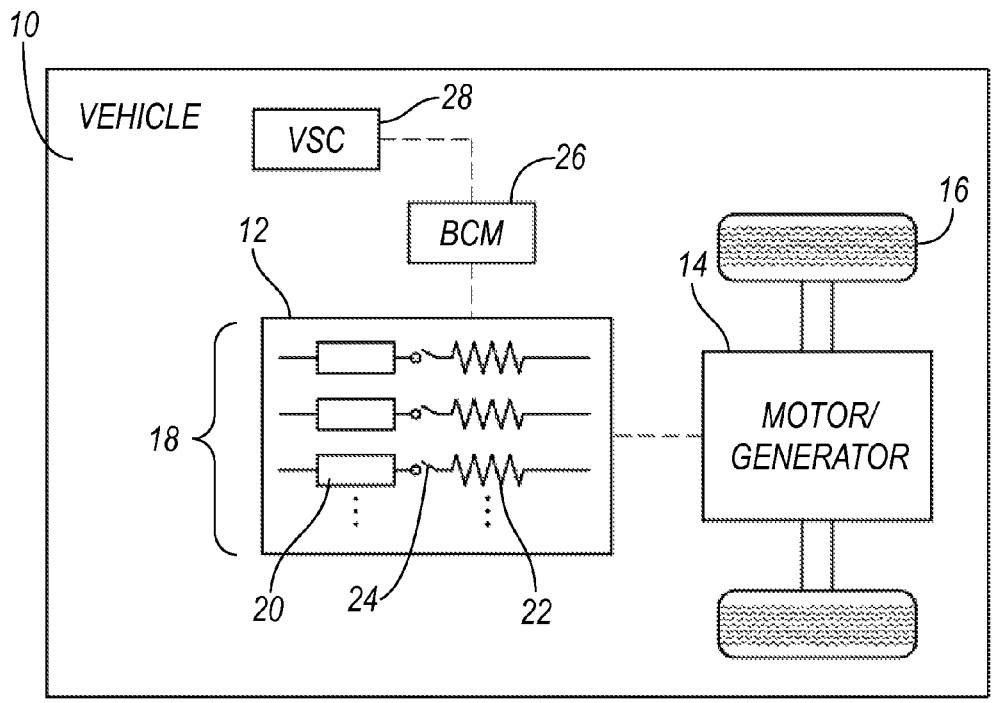
FIG. 1 is a schematic illustration of a vehicle having a fraction battery and an associated control module.

Referring to FIG. 1, a vehicle 10 is provided. The vehicle 10 can be a hybrid electric vehicle (HEV) having an engine and an electric machine capable of providing propulsion to the vehicle, a plug-in hybrid electric vehicle (PHEV) capable of being connected to an external power source for charging, a battery electric vehicle (BEV) having no engine and only being propelled by a high voltage battery, or any other vehicle that is at least partially propelled by a traction battery or battery system 12. The battery system 12 is electrically connected to an electric machine or motor/generator (M/G) 14. The M/G 14 can operate as a generator by receiving torque from an engine (not shown) or torque from wheels 16 through regenerative braking, for example. Alternatively, the M/G 14 can operate as a motor. That is, the M/G 14 can transform stored power from the battery system 12 to mechanical power to move the wheels 16.

The battery system 12 includes a battery pack 18 having a plurality of individual battery cells 20. Each of the battery cells 20 can be individually charged or discharged, as will be discussed further. Each battery cell 20 is connected to a respective resistor 22 in series via a switch 24. In other examples, the cells 20 can be connected in parallel to one or more resistors 22. Other arrangements are also possible. The switches 24 can be selectively opened or closed to complete the electrical connection between the cells 20 and their respective resistors 22. It should be understood that the switches 24 can be contactor or mechanical switches, or the switches 24 can be solid-state electrical switches such as transistors.

The vehicle 10 further includes a battery control module (BCM) 26 that controls the battery system 12 and a vehicle system controller (VSC) 28 that controls the BCM 26 as well as other controllers (not shown) within the vehicle 10. References to the BCM 26 or to a "controller" thus can refer to one or more controllers in the vehicle 10 that can directly or indirectly control the battery system 12. The BCM 26 can command the battery system 12 to receive current from the M/G 14 or a power source external to the vehicle 10 for charging, to provide current to the M/G 14 for propulsion, or to discharge current via the resistors 22 for discharging or cell balancing, as will be discussed. The BCM 26 can also monitor and regulate the relative charges of individual cells 20 within the battery pack 18.

The BCM 26 can maintain a balance or relative equilibrium in the state of charge ("SOC") among the cells 20. This may be referred to as cell balancing. Cell balancing can be accomplished, for example, by transferring energy from one cell 20 to another, or by dissipating energy in the cells 20 such that they all achieve a common voltage before subsequently charging them or discharging them for operation. Sensors (not shown) may be electrically connected to respective individual cells and powered directly by the attached cell. The sensors communicate the SOC of the respectively attached cell to the BCM 26 for input as to the need of cell balancing.

In one embodiment of cell balancing, the BCM 26 detects a minimum SOC via sensors attached to one or more of the cells 20. The minimum SOC represents a SOC of one cell with the lowest SOC in the battery pack 18. The other cells 20 in the battery pack 18 are then discharged by closing their respective switches 24 or other known discharging methods until the cells 20 each have a respective SOC is generally equivalent to the minimum SOC. In another embodiment of cell balancing, electrical energy is commanded to transfer from at least one battery cell 20 into the cell having the minimum SOC.

The BCM 26 can, in one example, command all of the battery cells 20 to discharge to the minimum SOC to achieve cell balancing. In another example, the BCM 26 can command a selected group of the battery cells 20 to discharge. In yet another example, the BCM 26 can command one or more of the battery cells 20 to transfer stored electric energy through wired circuitry into other cells 20 having a lower SOC such that the electric power is balanced between the cells 20. Other systems for cell balancing are also contemplated.

A trigger condition that initiates cell balancing of the battery 12 can be automatically generated. For example, the BCM 26 can command the switches 24 to close to discharge or deplete certain cells 20 in response to a high SOC relative to the other cells. Another trigger condition could arise if the BCM 26 detects a significant overcharge of one or more cells 20 above a threshold (e.g., a charge above 100% SOC). The BCM 26 can then command those cells 20 to discharge accordingly. Other automatic trigger conditions are contemplated in which the BCM 26 determines it necessary to initiate a cell balancing function of one or more of the cells 20.

When vehicles 10 that include a high voltage battery or battery system 12 are turned OFF, for example via a key-OFF event, the BCM 26 of the vehicle 10 may still command cell balancing functions and other battery-depletive commands. While the vehicle 10 is off, the BCM 26 may utilize existing battery power and run a continuous or interval check of relative SOC in the cells 20 and command a cell balancing function to maintain a relative equilibrium between the cells 20 of the battery system 12. These functions are unnecessarily wasteful over extended periods of vehicle nonuse. For example, if the vehicle 10 remains off while a user of the vehicle 10 is away for an extended period of time (e.g., during a vacation), the battery system 12 may have a SOC significantly lower than when the user last had the vehicle 10 on. This directly impacts the available power in the vehicle 10 when the vehicle 10 is next started. Furthermore, in PHEVs that are remained plugged into an external power source during the extended period of inactivity, wasteful energy may be drawn from the external power source into the vehicle 10 to maintain the cell balancing functions.

According to various embodiments as disclosed in the present disclosure, a system, method and controller are provided for inhibiting cell balancing functions and other battery depletive events during extended periods of inactivity.

Figure 2:
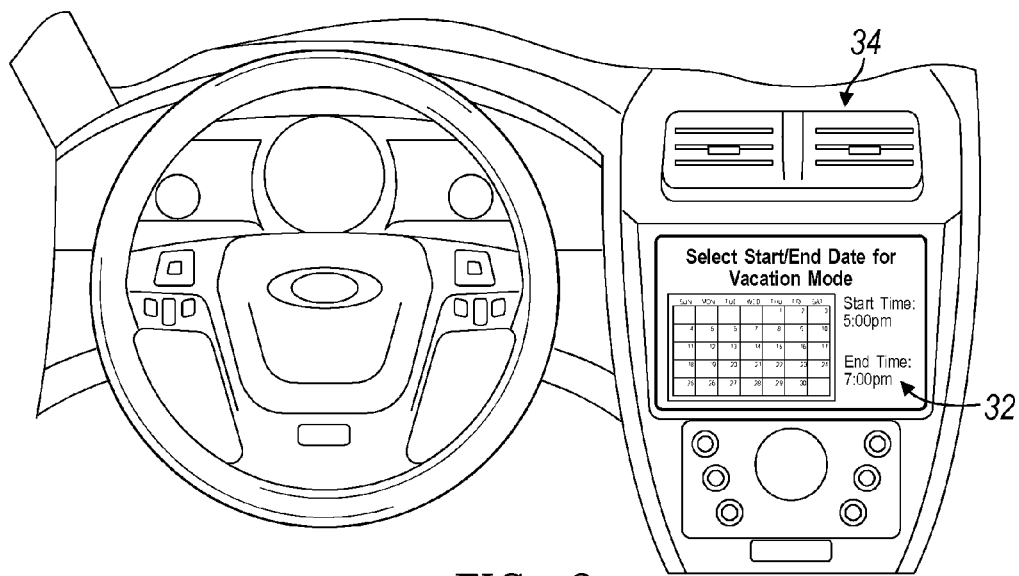
FIG. 2 is a front perspective view of a user interface in the vehicle of FIG. 1.

Referring to FIG. 2, a user interface 32 is provided. In this illustrative embodiment, the user interface 32 is provided within an infotainment system mounted to a dashboard area 34 of a passenger compartment of the vehicle 10. The user interface 32 may include a light-emitting diode (LED) screen, a plasma screen, an organic light-emitting diode (OLED) screen, or other such display screen. The user interface 32 may also be a touch screen, such that the user can select options and information presented to the user by touching the screen. The screen is electrically connected to a control module (e.g., BCM 26, VSC 28) to command actions based on the selections made by the user.

A vacation mode or hibernation mode may be set on the user interface 32 of the vehicle 10. For example, upon the user selecting an option to set the vehicle in the vacation mode, the user interface 32 may prompt the user with a calendar and/or a clock. The user can then set a start-date and an end-date, and/or a start-time and an end-time of any day. The starting and ending dates and times can generally be referred to as starting and ending moments. The period between the starting moments and ending moments define a user-selected time period that the vehicle 10 will automatically be in the vacation mode. During the vacation mode, the BCM 26 inhibits or otherwise does not allow a command of cell balancing. In this fashion, the user can define a predetermined, user-defined time period during which operation of the vehicle 10 is anticipated not to occur. At the end of the time period, the BCM 26 may then enable the cell balancing functions as previously described. Thus, when the user arrives at the vehicle 10 subsequent to the user-defined ending moment, the cells 20 are properly balanced while the battery system 12 remains at a higher SOC compared to the vehicle 10 if the vacation mode were not set.

In one embodiment, the starting moment and ending moment are not directly input by the user for each specific vacation mode. For example, the vehicle 10 may be equipped with a global positioning system (GPS). Upon the detection of the vehicle being in one location for a time exceeding a predetermined time (e.g., one day), the BCM 26 may command the vacation mode to be entered and inhibit cell balancing. This embodiment is also combinable with a learned scheduling software, in which the vehicle can determine driving patterns taken by the user, and inhibit cell balancing when the controllers of the vehicle estimate that the user will not be activating his vehicle for hours (or days) at a time.

Figure 3:
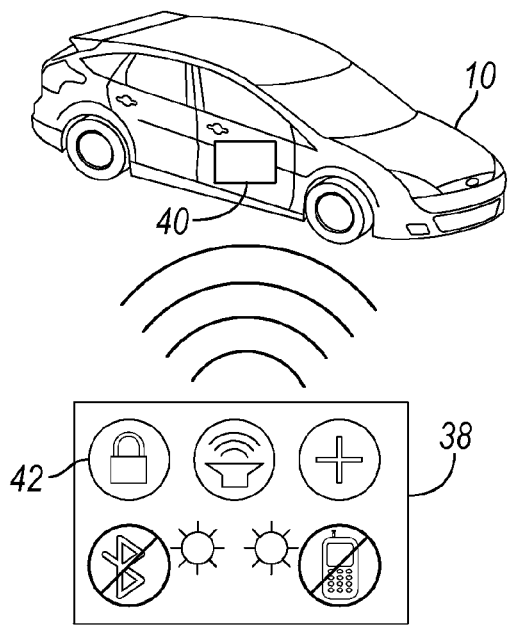
FIG. 3 is an illustrative hardware diagram of a key fob in communication with the vehicle.

The user-defined time period may be input to the controllers of the vehicle 10 remotely rather than directly into the vehicle's user interface 32. Referring to FIG. 3, the time period may be set by a key fob 38. The key fob 38 is programmed to wirelessly communicate with a receiver 40 mounted within the vehicle 10 that is electrically connected to the BCM 26. A user may, for example, depress a lock/unlock button 42 on the key fob 38 a number of times to set a starting moment for the vacation mode. The vacation mode is then active, and cell balancing is inhibited. The user-defined time period is, at that time, indefinite as an ending moment for the vacation mode has not been set. The user may subsequently return to the vehicle 10 and depress the lock/unlock button 42 a number of times to activate an ending moment, ending the vacation mode and enabling the vehicle to utilize cell balancing.

Rather than pressing the lock/unlock button 42 to disable the vacation mode, a key-ON event may also end the vacation mode. In such an embodiment, while the vehicle 10 is in the vacation mode and cell balancing is inhibited, the user may turn a key or otherwise activate the vehicle, which sets an ending moment and ends the inhibition of the cell balancing. The BCM 26 may then enable cell balancing before or during propulsion of the vehicle 10.

Figure 4:
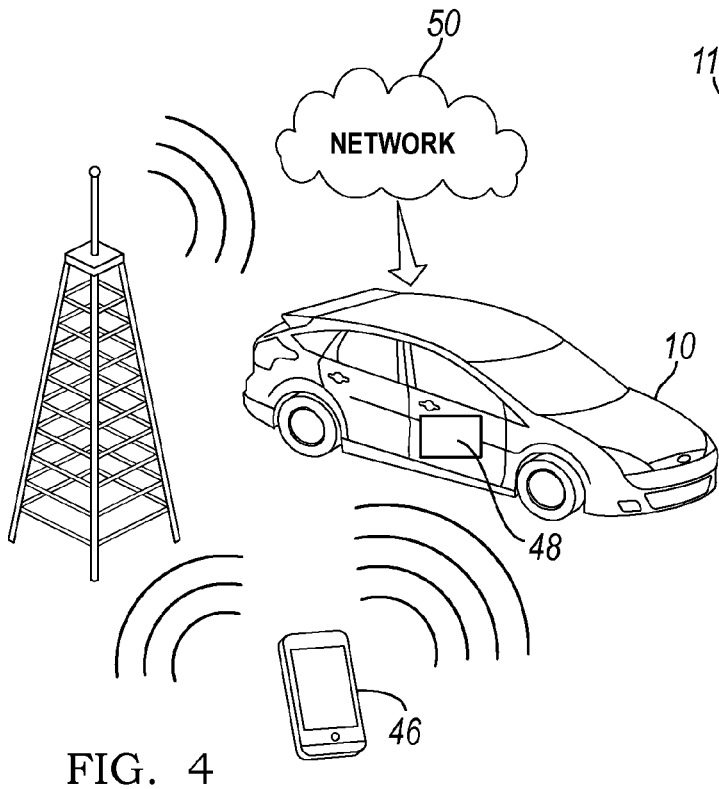
FIG. 4 is an illustrative hardware diagram of a mobile communication device in communication with the vehicle.

Referring to FIG. 4, the time period for the vacation mode may be set remotely from a mobile communication device 46 such as a cell phone or a computer remote from the vehicle 10. The mobile communication device 46 may wirelessly communicate with a transceiver 48 or another mobile communication device mounted to the vehicle 10. The receiver/transceiver 48 or other mobile communicate receives the user-defined time period as set by the remote mobile communication device 46. The mobile communication device 46 may include a similar calendar and time display, similar to that of the user interface 32 in the vehicle. A user can set a start-date, and end-date, a start-time, and/or an end-time to define the time period. The time period is wirelessly transmitted via a cellular data network 50 to the receiver/transceiver 48, or directly to the receiver/transceiver 48 of the vehicle 10. The receiver/transceiver 48 transmits the user-defined time period to the BCM 26, and the BCM 26 inhibits cell transferring functions in the battery system 12 for the length of the time period, according to methods previously described.

It should be understood that the mobile communication device 46 may be a cell phone that transmits the time period to the receiver/transceiver 48 via existing cellular networks 50. Alternatively, the mobile communication device 46 may be a computer that transmits the time period via an internet network that wirelessly communicates with the receiver/transceiver 48 according to known methods.

Figure 5:
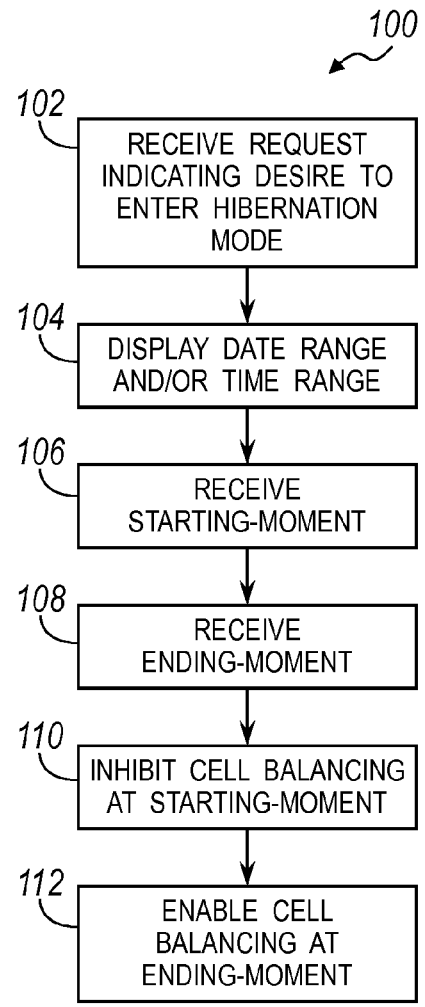
FIG. 5 is a flow chart illustrating an algorithm programmed into a controller within the vehicle to control the cell balancing functions of the vehicle.

Referring to FIG. 5, a method or algorithm 100 is illustrated. The algorithm 100 can be programmed into the BCM 26 or other controller within the vehicle 10. At operation 102, the BCM 26 receives a request from a user indicating the user desiring to setup a hibernation or vacation mode in which cell balancing is disabled. Operation 102 can be initiated by the user scrolling through menus via the user interface 32, via a mobile communication device 46, or by depressing a button 42 on the key fob 38, according to methods previously described.

At operation 104, in response to the request to setup a hibernation mode, a starting and/or ending moment is displayed for the user. The starting and/or ending moment can be in the form of a calendar, a list of dates, a clock, a list of times, and the like. The starting and/or ending moments can be displayed on the user interface 32, the mobile communication device 46, or any other suitable device communicable with the controllers of the vehicle 10. Of course, in embodiments such as the one illustrated in FIG. 3, if the user sets a starting moment from a key fob 38, operation 104 may not be necessary.

At operation 106, the starting moment is received by the BCM 26 or other controller from the apparatuses described above. Similar to operation 106, at operation 108 the ending moment is received by the BCM 26 or other controller from the apparatuses described above At operation 110, the cell balancing is inhibited in response a time/day equating to the starting moment. Cell balancing is inhibited at the time of the starting moment, and is not enabled until the time/day of the ending moment, illustrated at operation 112.

It should be understood that pursuant to embodiments described above, the ending moment may not necessarily be received before the inhibiting of the cell balancing. For example, if the user sets the starting moment of the hibernation mode without setting an ending moment, the vehicle may continuously inhibit cell balancing. It is not until the ending moment is received and matched with the current day/time that the cell balancing is inhibited. In one embodiment, the user sets a starting moment from the key fob 38, the cell balancing inhibition is initiated, and the BCM 26 does not enable cell balancing until a key-ON event or another action taken by the key fob 38. Therefore, the specific arrangement of the operations 102-112 are not intended to be limiting nor required, but rather intended to be exemplary.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle comprising:
a GPS;

a battery pack including a plurality of cells;

an electric machine configured to transform electrical power from the battery pack to motive power for the vehicle;

a receiver configured to receive a wireless signal from a key fob; and at least one controller programmed to inhibit cell balancing for a user-defined time period that is initiated in response to receiving the wireless signal and initiated in response to receiving a location of the vehicle via the GPS.

2. The vehicle of claim 1, wherein the at least one controller is further programmed to command cell balancing in response to an expiration of the user-defined time period.

3. The vehicle of claim 2, wherein the at least one controller is configured to command a transfer of electric energy between the cells to define the cell balancing.

4. The vehicle of claim 2, wherein the at least one controller is configured to command a depletion of electric energy of one of the plurality of cells out of the battery pack to define the cell balancing.

5. The vehicle of claim 1, wherein a key-ON event defines a termination of the user-defined time period such that the at least one controller is further programmed to enable cell balancing in response to the key-ON event.

6. The vehicle of claim 1, further comprising a user interface in communication with the at least one controller, wherein the at least one controller is further programmed to display a calendar for a user to select a start-date and end-date, the user-defined period defined by the start-date and end-date.

7. The vehicle of claim 1, further comprising a user interface in communication with the at least one controller, wherein the at least one controller is further programmed to display various times for a user to select a start-time and an end-time, the user-defined period defined by the start-time and the end-time.

8. The vehicle of claim 1, further comprising a transceiver in communication with the at least one controller, wherein the user-defined period is defined by at least one of a date-range and a time-range received by the transceiver.

9. The vehicle of claim 1, further comprising a mobile communication device in communication with the at least one controller and capable of receiving the user-defined period via wireless communication.

10. The vehicle of claim 1, wherein the at least one controller is further configured to subsequently receive an end-time of the user-defined time period from the key fob via the receiver.

11. A method of controlling cell-balancing functions in a vehicle having a high-voltage traction battery, the method comprising:

receiving a location of the vehicle via a GPS; and inhibiting cell balancing within a high-voltage traction battery for a user-defined time period that initiates based upon the received location.

12. The method of claim 11, further comprising subsequently enabling the cell balancing in response to an expiration of the user-defined time period.

13. The method of claim 11, further comprising displaying a calendar on a user interface, wherein the user-defined period is defined by a start-date and an end-date selected by the user on the calendar of the user interface.

14. The method of claim 13, wherein the user interface is mounted in the vehicle.

15. The method of claim 13, wherein the user interface is part of a mobile communication device capable of wirelessly communicating the start-date and the end-date to the vehicle.

16. The method of claim 11, further comprising displaying a plurality of times on a user interface, wherein the user-defined period is defined by a start-time and an end-time selected by the user on the user interface.

17. The method of claim 16, wherein the user interface is mounted in the vehicle.

18. The method of claim 16, wherein the user interface is part of a mobile communication device capable of wirelessly communicating the start-time and the end-time to the vehicle.

19. The method of claim 11, wherein the user-defined time period of inhibiting cell balancing initiates based upon locational driving patterns.

* * * * *